(12) United States Patent
Han et al.

(10) Patent No.: US 7,307,566 B2
(45) Date of Patent: Dec. 11, 2007

(54) APPARATUS AND METHOD OF STABILIZING SIGMA-DELTA MODULATOR FOR FRACTIONAL-N PHASE-LOCKED-LOOP

(75) Inventors: Andrew Han, Seoul (KR); Hee-mun Bang, Seoul (KR); Heung-bae Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 11/360,614

(22) Filed: Feb. 24, 2006

(65) Prior Publication Data

US 2006/0192704 A1    Aug. 31, 2006

(30) Foreign Application Priority Data

Feb. 25, 2005   (KR) ...................... 10-2005-0015984

(51) Int. Cl.
*H03M 3/00* (2006.01)
(52) U.S. Cl. ........................ 341/143; 341/126
(58) Field of Classification Search ......... 341/143–170
See application file for complete search history.

(56) References Cited

U.S. PATENT DOCUMENTS

| | | | | |
|---|---|---|---|---|
| 5,598,158 A | * | 1/1997 | Linz ............................. | 341/143 |
| 5,623,263 A | * | 4/1997 | Kuo et al. .................... | 341/143 |
| 5,673,044 A | * | 9/1997 | Pellon .......................... | 341/143 |
| 5,682,160 A | * | 10/1997 | Ribner et al. ................ | 341/143 |
| 6,057,793 A | * | 5/2000 | Gong et al. .................. | 341/143 |
| 6,587,063 B1 | * | 7/2003 | Su ............................... | 341/143 |
| 6,600,789 B1 | * | 7/2003 | Lipasti et al. ................ | 341/143 |

FOREIGN PATENT DOCUMENTS

JP    10-320075 A    12/1998

* cited by examiner

*Primary Examiner*—Lam T. Mai
(74) *Attorney, Agent, or Firm*—Sughrue Mion Pllc.

(57) ABSTRACT

A sigma-delta modulation method with low complexity is provided. To this end, in the present invention, an input signal is forwarded and an output signal is fed back to thus reduce the range of the noise transfer function of the sigma-delta modulator and to lower the frequency offset and the phase noise at low frequencies. A sigma-delta modulator for a frequency synthesizer may include one or more modulation units which are connected in series and perform a sigma-delta modulation to an input signal and a provided accumulated signal using a signal which is weighted with a feedback coefficient; and an output adder which adds an output signal from a terminal section of the modulation units and the input signal, and outputs the added signal for feedback to the modulation units.

20 Claims, 4 Drawing Sheets

APPARATUS AND METHOD OF STABILIZING SIGMA-DELTA MODULATOR FOR FRACTIONAL-N PHASE-LOCKED-LOOP

CROSS-REFERENCE TO RELATED APPLICATIONS

This application claims priority, under 35 U.S.C. §119(a), from Korean Patent Application No. 10-2005-0015984 filed on Feb. 25, 2005 in the Korean Intellectual Property Office, the entire disclosure of which is incorporated herein by reference.

BACKGROUND OF THE INVENTION

1. Field of the Invention

Apparatuses and methods consistent with the present invention relate to frequency synthesis, and more particularly, to fractional-N frequency synthesis using a sigma-delta modulation.

2. Description of the Related Art

Recently, there are increasing demands for real-time multimedia data services from users who utilize wireless communications. That is, users desire to not only access Internet at high data rate but also receive video data in real-time using mobile communication terminals.

In response to this trend, code division multiple access (CDMA) 2000 currently developed allows high-speed data services at 144 kbps which is a conventional CDMA band. A frequency synthesizer, which is used for the high-speed data services, needs to satisfy a setting time under 500 μs, an accurate frequency resolution at intervals of 10 kHz, and a phase noise below −135 dBc/Hz around 1 MHz offset frequency all together. Particularly, to meet the requirement of the setting time under 500 μs, the frequency synthesizer has a phase-locked-loop (PLL) bandwidth more than 10 kHz at minimum.

Typically, integer-N frequency synthesizers are widely used in mobile communication systems such as CDMA. The integer-N frequency synthesizer is subject to a structural constraint that a reference frequency should match a channel bandwidth. The channel bandwidth of a frequency synthesizer can be defined as a frequency resolution for selecting an accurate channel. In other words, the channel bandwidth lower than 30 kHz and 10 kHz, respectively should be used. On account of this requirement, the integer-N frequency synthesizer is not applicable to a system which requires a fast setting time below several microseconds.

Conventional frequency synthesizers include a fractional-N frequency synthesizer, in addition to the integer-N frequency synthesizer. The fractional-N frequency synthesizer mostly uses a multi-bit modulator or a MASH-type modulator. In general, the fractional-N frequency synthesizer is implemented in the form of a phase-locked-loop (PLL) including a modulator.

FIG. 1 is a circuit diagram showing a MASH-type modulator applied to a conventional fractional-N frequency synthesizer. Particularly, FIG. 1 depicts a $4^{th}$ MASH modulator. Referring to FIG. 1, the $4^{th}$ MASH modulator includes adders 100a through 100d, delay elements 120a through 120c, and accumulators 140a through 140d.

An integer part input signal N(k) denotes an input signal relating to an integer pan in a division ratio. The integer part input signal N(k) is input to the adder 100a and added with the output of the adder 100b to thus generate a final division ratio signal $N_{div}(k)$. A fractional part input signal f(k) denotes a fractional part in the division ratio, that is, denotes an input signal relating to the division ratio below the radix point. The fractional part input signal f(k) is accumulated at the accumulators 140a through 140d connected in series. The output of each accumulator 140a through 140d is fed to the input x of the next accumulator 140a through 140d. The overflows ovfl output from the respective accumulators 140a through 140d are added at the adders 100b, 100c, and 100d. For instance, the adder 100d adds the overflows of the accumulator 140d and the accumulator 140c, and delays the resultant value by the output of the delay element 120c, that is, subtracts a certain delay value from the overflow of the accumulator 140d. The subtracted value is fed into the adder 100c. The other adders 100c and 100b operate in the similar manner. The output s of the adder 100b can be a combination component of signal and noise.

The fractional-N frequency synthesizer using the MASH modulator as shown in FIG. 1 features a fast setting time. However, disadvantageously, a phase noise increases around 1 MHz and a satisfactory performance is not shown when obtaining an accurate resolution at 10 kHz. In reference to a paper entitled "A 1.1 GHz CMOS Fractional-N Frequency Synthesizer with a 3b $3^{rd}$-Order ΣΔ Modulator" by W. Rhee, A. All, and B. Song, ISSCC (International Solide-State Circuit Conference) 2000, pp. 198-1008, it is difficult to apply a fractional-N frequency synthesizer using a multi-bit modulator to actual mobile terminal systems because such a frequency synthesizer suffers large spurs about −40 dB at a particular condition. In other words, the multi-bit modulator or the MASH modulator requires high linearity according to operational characteristics of the PLL. Yet, in practice, the PLL cannot show the required high linearity due to nonlinearity resulted from a phase frequency detector or a multi-modulus divider therein.

U.S. Pat. No. 6,107,947 discloses a $3^{rd}$ sigma-delta modulator which disadvantageously increases complexity. A sigma-delta modulator disclosed in U.S. Pat. No. 5,742,246 also increases complexity as well. Thus, a demand arises for a novel frequency synthesizer for resolving the above-mentioned disadvantages.

SUMMARY OF THE INVENTION

An aspect of the present invention is to provide a sigma-delta modulator with low complexity and a modulation method.

A sigma-delta modulator for frequency synthesis may include a modulation unit which performs a sigma-delta modulation on an input signal using a feedback coefficient; and an output adder which adds an output signal of the modulation unit and the input signal to generate an added signal which is output.

A sigma-delta modulation method may include performing a sigma-delta modulation on an input signal using a feedback coefficient; and forwarding the input signal so that the forwarded input signal is added to the sigma-delta modulated input signal; and outputting the added signal.

BRIEF DESCRIPTION OF THE DRAWING FIGURES

The above and/or other aspects and advantages of the invention will become apparent and more readily appreciated from the following description of exemplary embodiments, taken in conjunction with the accompanying drawing figures of which:

DETAILED DESCRIPTION OF THE EXEMPLARY

EMBODIMENTS

Figure 1:
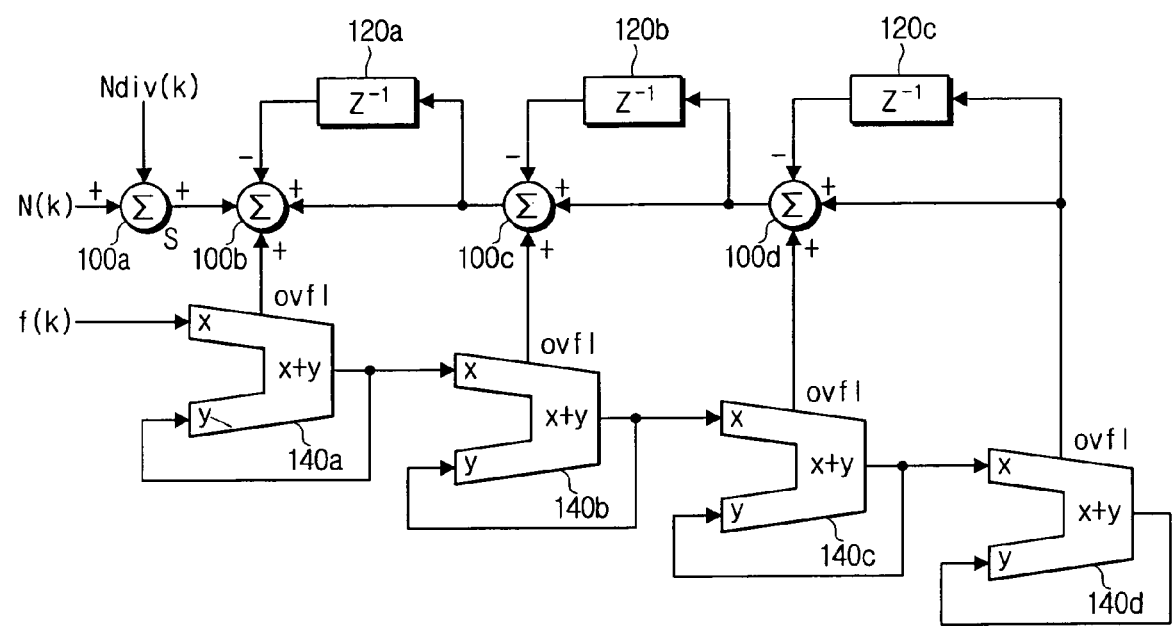
FIG. 1 illustrates a MASH-type modulator applied to a conventional fractional-N frequency synthesizer.

Certain exemplary embodiments of the present invention will now be described in greater detail with reference to the accompanying drawings.

In the following description, same drawing reference numerals are used for the same elements even in different drawings. The matters defined in the description, such as detailed construction and element descriptions, are provided to assist in a comprehensive understanding of the invention. Also, well-known functions or constructions are not described in detail since they would obscure the invention in unnecessary detail.

Figure 2:
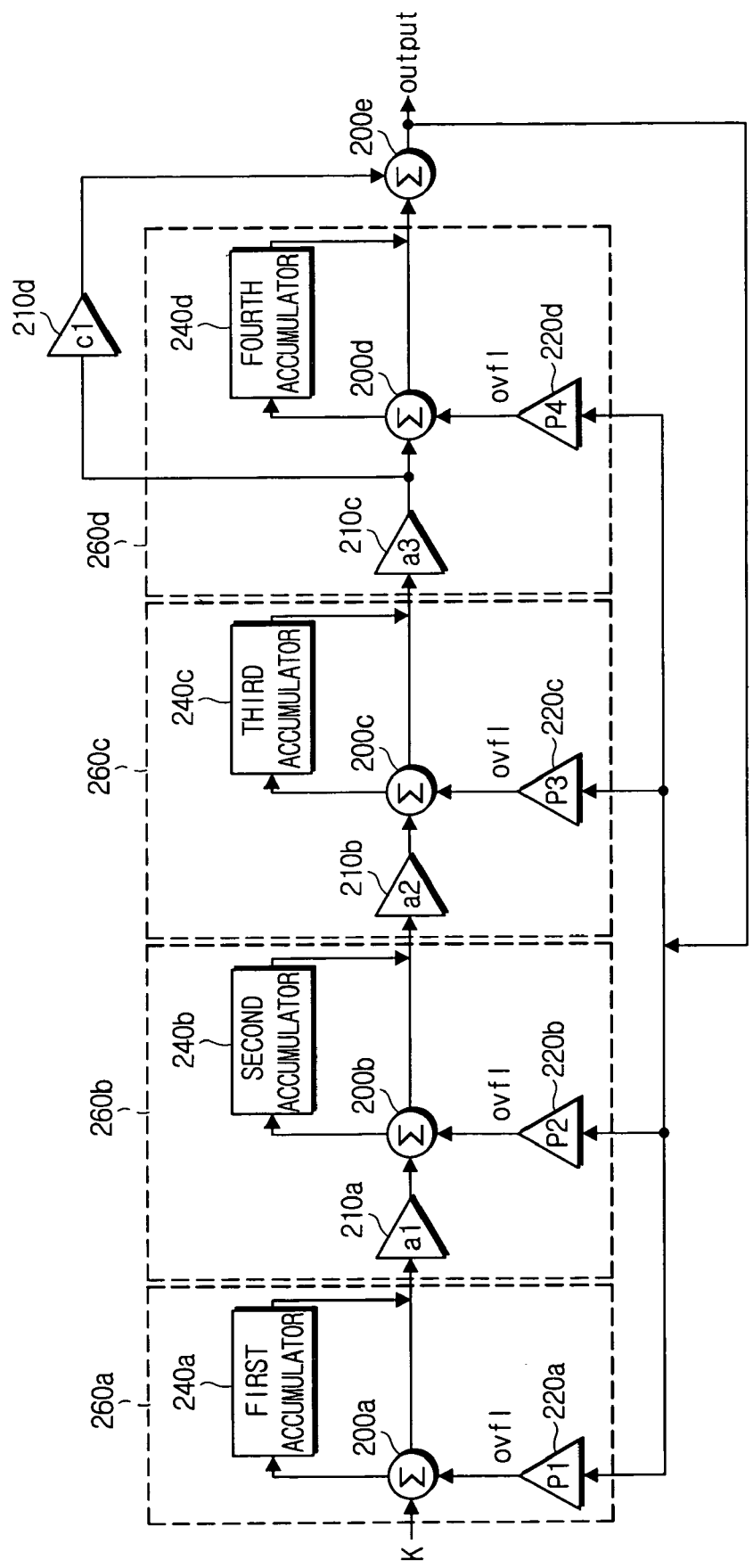
FIG. 2 illustrates a sigma-delta modulator for a fractional-N frequency synthesizer according to an exemplary embodiment of the present invention.

FIG. 2 depicts a sigma-delta modulator according to an exemplary embodiment of the present invention. As shown FIG. 2, the sigma-delta modulator is a fourth-order modulator and includes a first modulation section 260a, a second modulation section 260b, a third modulation section 260c and a fourth modulation section 260d. The first modulation section 260a through the fourth modulation section 260d are connected in series and perform a sigma-delta modulation by using a signal k input from outside and certain feedback coefficients pi (i=1, 2, 3, 4). The feedback coefficients are selected by an output signal of a fifth adder 200e. The first modulation section 260a includes a first adder 200a, a first amplifier 220a, and a first accumulator 240a. The first adder 200a adds the input signal k and an output signal of the first amplifier 220a. The first adder 200a forwards the resultant signal to the first accumulator 240a and the second modulation section 260b. The first accumulator 240a accumulates the signal received from the first adder 200a and a previous accumulated signal, and outputs the accumulated signal. The first amplifier 220a weights the received signal with the feedback coefficient p1 and outputs the weighted signal.

The second modulation section 260b includes a first weighter 210a, a second adder 200b, a second amplifier 220b, and a second accumulator 240b. The first weighter 210a weights the received signal with a certain number a1 and outputs the weighted signal. The second adder 200b adds the signal fed from the first weighter 210a and a signal fed from the second amplifier 220b. The signal output from the second adder 200b is forwarded to the second accumulator 240b and the third modulation section 260c. The second accumulator 240b accumulates the signal fed from the second adder 200b and a previous accumulated signal, and outputs the accumulated signal. The second amplifier 220b applies the feedback coefficient p2 to the fed signal and outputs the weighted signal.

The third modulation section 260c includes a second weighter 210b, a third adder 200c, a third amplifier 220c, and a third accumulator 240c. The second weighter 210b weights the fed signal with a certain number a2 and outputs the weighted signal. The third adder 200c outputs a signal by adding the signal fed from the second weighter 210b and a signal fed from the third amplifier 220c. The signal output from the third adder 200c is forwarded to the third accumulator 240c and the fourth modulation section 260d. The third accumulator 240c outputs a signal by accumulating the signal fed from the third adder 200c and a previous accumulated signal. The third amplifier 220c outputs a signal by applying the feedback coefficient p3 to the fed signal.

The fourth modulation section 260d includes a third weighter 210c, a fourth adder 200d, a fourth amplifier 220d, and a fourth accumulator 240d. The third weighter 210c weights the fed signal with a certain number a3 and outputs the weighted signal. The fourth adder 200d outputs a signal by adding the signal fed from the third weighter 210c and a signal fed from the fourth amplifier 220d. The signal output from the fourth adder 200d is provided to the fourth accumulator 240d and the fifth adder 200e. The fourth accumulator 240d outputs a signal by accumulating the signal fed from the fourth adder 200d and a previous accumulated signal. The fourth amplifier 220d outputs a signal by applying the feedback coefficient p4 to the fed signal.

The fourth weighter 210d outputs a signal by weighting the signal output from the third weighter 210c with a certain number c1. As such, since the output signal is fed back or the signal output from the modulation section is forwarded, a range of a noise transfer function of the sigma-delta modulator can be reduced at a low frequency, or frequency offset and phase noise can be lowered. Specifically, the signal output from the third weighter 210c of the fourth modulation section 260d is forwarded to the fifth adder 200e in FIG. 2. Equation 1 shows the noise transfer function as below:

$$H(z)=(1-z^{-1})^4/D(z). \quad \text{[Equation 1]}$$

In Equation 1, H(z) denotes the noise transfer function, and D(z) is expressed as Equation 2.

$$D(z)=1+p1z^{-1}+p2z^{-2}+p3z^{-3}+p4z^{-4} \quad \text{[Equation 2]}$$

where p1, p2, p3 and p4 denote the feedback coefficients.

Figure 3:
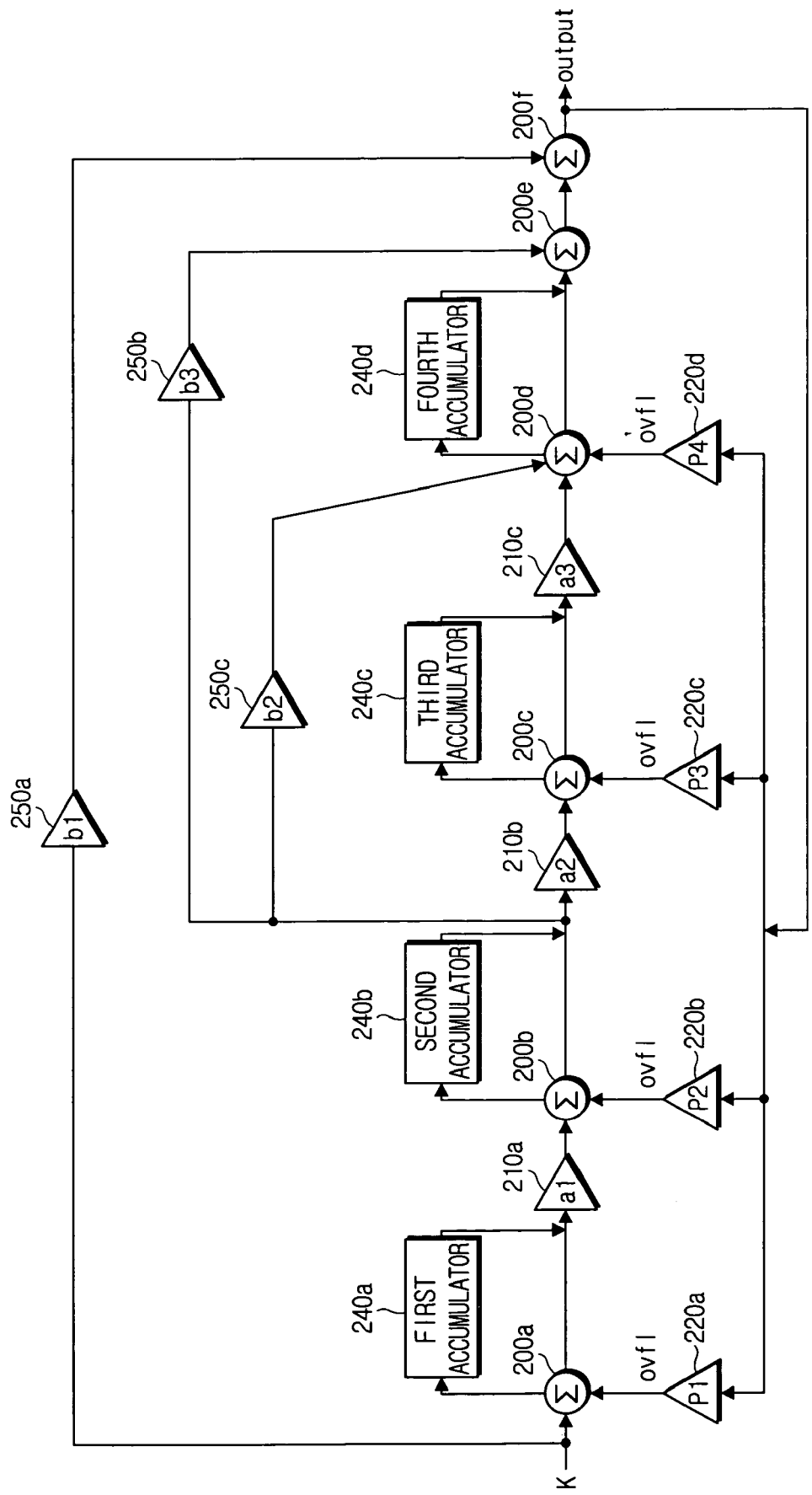
FIG. 3 illustrates a modified sigma-delta modulator for the fractional-N frequency synthesizer according to an exemplary embodiment of the present invention.

FIG. 3 depicts another sigma-delta modulator according to an exemplary embodiment of the present invention. Hereafter, descriptions are made with regard to differences of FIG. 3 from FIG. 2.

The input signal is fed to a fifth weighter 250a. The fifth weighter 250a weights the fed signal with a certain number b1 and forwards the weighted signal to a sixth adder 200f. The same signal as fed into the second weighter 210b is provided to a sixth weighter 250b and a seventh weighter 250c. The sixth weighter 250b weights the provided signal with a certain number b3 and forwards the weighted signal to the fifth adder 200e. The seventh weighter 250c weights the provided signal with a certain number b2 and feeds the weighted signal to the fourth adder 200d. The fourth adder 200d adds the signals fed from the third weighter 210c, the seventh weighter 250c, and the third amplifier 220d, and outputs the added signal. The fifth adder 200e adds the signals fed from the fourth adder 200d, the fourth accumulator 240d and the sixth weighter 250b, and outputs the added signal. The sixth adder 200f adds the signals fed from the fifth adder 200e and the fifth weighter 250a, and outputs the added signal. The output signal of the sixth adder 200f is provided to the first amplifier 220a through the fourth amplifier 220d.

The sigma-delta modulator in FIG. 3 has D(z) as expressed in Equation 2. For instance, p1 through p4 can be expressed as the following Equation 3.

$$p1 = a1b3-3$$

[Equation 3]

$$p2 = 4-2a1b3+a1a2a3(a2+b2)$$

$$p3 = 3-a1b2+a1a2a3(a3+b3)$$

$$p4 = a1b3-a1a2a3b2-1$$

The output signal of the respective modulation sections 260a through 260d can be forwarded using other various schemes than those shown in FIGS. 2 and 3. For instance, at least one of the signals output from the first through fourth modulation sections 260a through 260d is forwarded. The signal from one of the first through fourth modulation sections 260a through 260d is forwarded to at least one of the adders which perform the subsequent operations.

Figure 4:
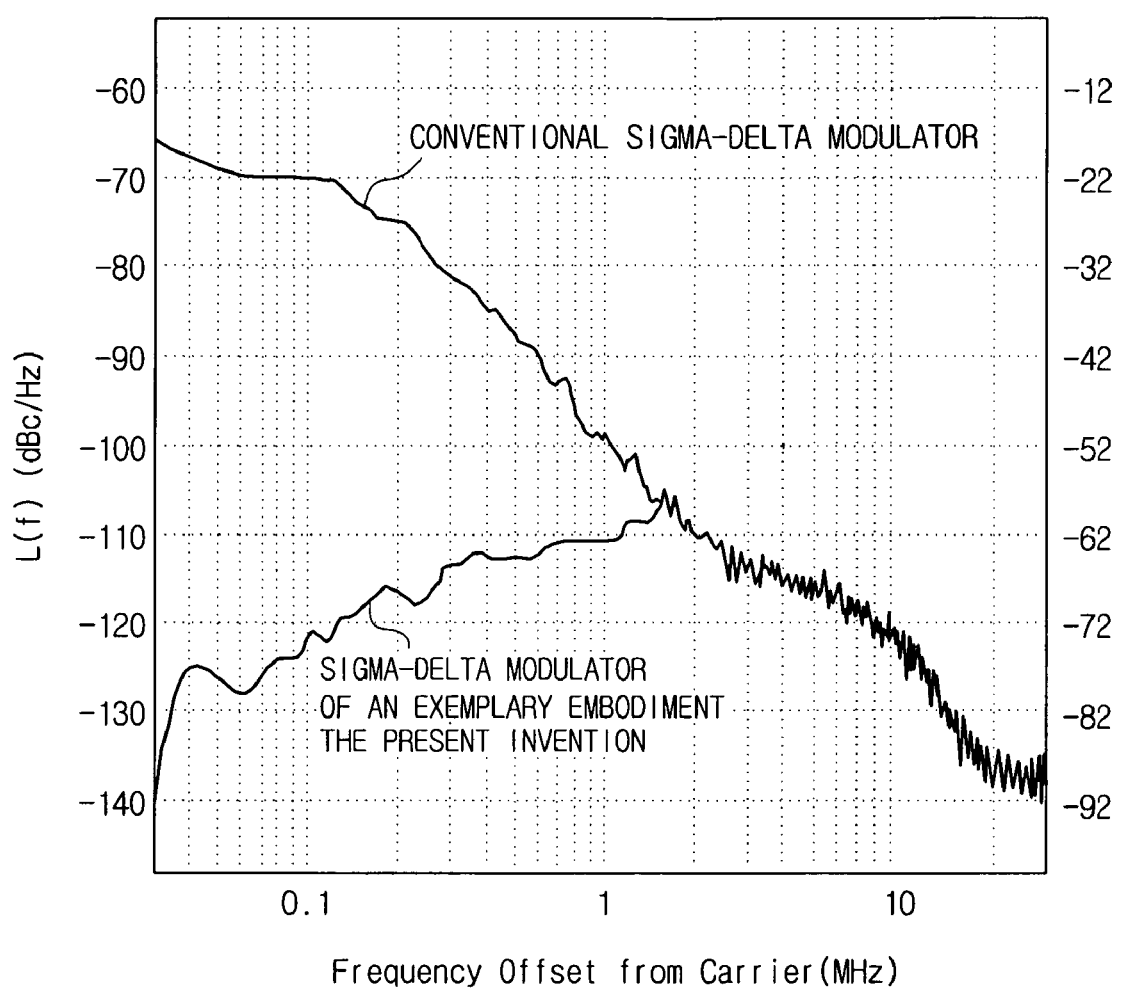
FIG. 4 illustrates an effect comparison between the sigma-delta modulator according to the exemplary embodiment of the present invention and the conventional sigma-delta modulator.

FIG. 4 is a graph for comparing phase noise between a conventional sigma-delta modulator and the sigma-delta modulator according to an exemplary embodiment of the present invention. As shown in FIG. 4, the sigma-delta modulator of the present invention drastically reduces the phase noise transferred through a lower frequency band.

As set forth above, the present invention feeds back or forwards the signal to thus reduce the range of the noise transfer function of the sigma-delta modulator and to lower the frequency offset and the phase noise at the low frequency.

While the present invention has been particularly shown and described with reference to exemplary embodiments thereof, it will be understood by those skilled in the art that various changes in form and details may be made therein without departing from the spirit and scope of the invention as defined by the appended claims.

What is claimed is:

1. A sigma-delta modulator comprising:
a plurality of modulation units which are connected in series, at least one of the modulation units performing a sigma-delta modulation using an input signal for the at least one of the modulation units, a previously-accumulated signal, and a feedback signal weighted with a feedback coefficient; and
an output adder which adds an output signal of a terminal modulation unit of the modulation units and at least one of input signals for the modulation units forwarded to the output adder to generate an added signal which is output, wherein the added signal is weighted with the feedback coefficient to constitute the feedback signal.

2. The sigma-delta modulator of claim 1, wherein the feedback coefficient used in the sigma-delta modulation is determined by measuring the added signal from the output adder.

3. The sigma-delta modulator of claim 1, further comprising a weighter which weights the at least one of input signals with a weighting coefficient and forwards the weighted at least one of input signals to the output adder.

4. The sigma-delta modulator of claim 1, wherein the at least one of the modulation units comprises a weighter which weights the input signal for the at least one of the modulation units with another weighting coefficient before the sigma-delta modulation.

5. The sigma-delta modulator of claim 1,
wherein the at least one of the modulation units, if the at least one of the modulation units is not the terminal modulation unit, comprises:
an adder which adds the input signal and the feedback signal, and outputs a resultant signal to a next modulation unit;
an accumulator which accumulates a signal received from the adder to the previously-accumulated signal, and outputs an accumulated signal to the next modulation unit; and
an amplifier which weights the added signal with the feedback coefficient and transmits the weighted added signal as the feedback signal to the adder,
wherein if the at least one of the modulation units is the terminal modulation unit, the resultant signal and the accumulated signal are output to the output adder instead of the next modulation unit.

6. The sigma-delta modulator of claim 1, wherein a signal, which is output from the at least one of the modulation units, which is not the terminal modulation unit, and which is input to a next modulation unit, is forwarded to at least one of the other modulation units which are disposed after the next modulation unit.

7. The sigma-delta modulator of claim 6, wherein the signal forwarded to the at least one of the other modulation units is added to the input signal and the feedback signal for the at least one of the other modulation units.

8. The sigma-delta modulator of claim 6, further comprising a weighter which weights the forwarded signal with a weighting coefficient.

9. The sigma-delta modulator of claim 1, wherein a noise transfer function is expressed as below:

$$H(z) = (1-z^{-1})^n/D(z)$$

$$D(z) = 1 + \sum_{k=1}^{n} p_k z^{-k},$$

where H(z) denotes the noise transfer function, n denotes a number of the modulation units, and $p_k$ denotes the feedback coefficient.

10. The sigma-delta modulator of claim 9, wherein the at least one of the modulation units comprises a weighter which weights the input signal for the at least one of the modulation units with a weighting coefficient before the sigma-delta modulation.

11. A sigma-delta modulation method comprising:
performing a plurality of sigma-delta modulations, at least one of the sigma-delta modulations using an input signal for the at least one of the sigma-delta modulations, a previously-accumulated signal, and a feedback signal weighted with a feedback coefficient;
forwarding at least one of input signals for the sigma-delta modulations, so that the forwarded input signal is added to an output signal of a terminal sigma-delta modulation of the sigma-delta modulations; and
outputting the added signal, wherein the added signal is weighted with the feedback coefficient to constitute the feedback signal.

12. The sigma-delta modulation method of claim 11, wherein the feedback coefficient used in the sigma-delta modulation is determined by measuring the added signal.

13. The sigma-delta modulation method of claim 11, wherein the forwarded at least one of input signals is weighted with a weighting coefficient prior to the forwarding.

14. The sigma-delta modulation method of claim 11, wherein the at least one of input signals for the sigma-delta modulations is weighted with another weighting coefficient before the sigma-delta modulation.

15. The sigma-delta modulation method of claim 11, wherein the at least one of the sigma-delta modulations, if the at least one of the sigma-delta modulations is not the terminal sigma-delta modulation, comprises:

weighting the added signal with the feedback coefficient;

adding the input signal and the weighted added signal, and outputting a resultant signal to a next sigma-delta modulation; and accumulating a signal, received from the adding of the input signal and the weighted added signal, to the previously-accumulated signal, and outputting an accumulated signal to the next sigma-delta modulation, wherein if the at least one sigma-delta modulation is the terminal sigma-delta modulation, the resultant signal and the accumulated signal are added to constitute the added signal.

16. The sigma-delta modulation method of claim 11, wherein a noise transfer function is expressed as below:

$$H(z) = (1 - z^{-1})^n / D(z)$$

$$D(z) = 1 + \sum_{k=1}^{n} p_k z^{-k},$$

where $H(z)$ denotes the noise transfer function, n denotes a number of the sigma-delta modulations, and $p_k$ denotes the feedback coefficient.

17. The sigma-delta modulation method of claim 16, wherein the at least one of input signals for the sigma-delta modulations is weighted with a weighting coefficient before the sigma-delta modulation.

18. The sigma-delta modulation method of claim 11, wherein a signal, which is output from the at least one of the sigma-delta modulations, which is not the terminal sigma-delta modulation, and which is input to a next sigma-delta modulation, is forwarded to at least one of the other sigma-delta modulations performed after the next sigma-delta modulation.

19. The sigma-delta modulation method of claim 18, wherein the signal forwarded to the at least one of the other sigma-delta modulations is added to the input signal and the feedback signal for the at least one of the other modulation units.

20. The sigma-delta modulation method of claim 18, further comprising weighting the forwarded signal with a weighting coefficient.

* * * * *